United States Patent
Ha

[11] Patent Number: 5,999,578
[45] Date of Patent: Dec. 7, 1999

[54] AUTOMATIC GAIN CONTROL CIRCUIT OF RADIO RECEIVER

[75] Inventor: Ji-Won Ha, Kyungki-do, Rep. of Korea

[73] Assignee: SamSung Electronics Co., Ltd., Kyungki-do, Rep. of Korea

[21] Appl. No.: 08/845,178

[22] Filed: Apr. 21, 1997

[30] Foreign Application Priority Data

Apr. 19, 1996 [KR] Rep. of Korea ................... 96-11953

[51] Int. Cl.$^6$ ............................ H04L 27/08; H04B 1/06
[52] U.S. Cl. ................. 375/345; 455/250.1; 455/247.1; 455/234.1
[58] Field of Search ....................... 375/345; 455/234.1, 455/233.1, 232.1, 250.1, 247.1

[56] References Cited

U.S. PATENT DOCUMENTS

| | | | |
|---|---|---|---|
| 5,507,023 | 4/1996 | Suganuma et al. | 455/234.1 |
| 5,722,062 | 2/1998 | Nakanishi et al. | 455/247.1 |

FOREIGN PATENT DOCUMENTS 637 130 A2  2/1995  European Pat. Off. .

Primary Examiner—Stephen Chin
Assistant Examiner—Betsy L. Deppe
Attorney, Agent, or Firm—Robert E. Bushnell, Esq.

[57] ABSTRACT

An automatic gain control circuit which is digitally embodied to prevent deterioration of bit error rate generated by saturation of a low noise amplifier located at the front stage of a receiver through an input of high power to an antenna, thereby simplifying construction thereof and improving commercialization. The automatic gain control circuit of a radio data communication system using a spread spectrum method utilizes a low noise amplifier for low noise amplifying a bandpass filtered signal received through an antenna; a limiter for generating a received signal strength indicator voltage in order to constantly maintain the signal received as a local oscillation frequency through the antenna before downward frequency conversion; a unit for separating the a signal transmitted through the limiter to I and Q channels; a comparator for comparing the received signal strength indicator voltage with a given reference voltage; a D flip-flop for inputting an output of the comparator applied to a data input terminal in synchronization to a given first control signal; an AND gate for ANDing the output of the D flip-flop and the first control signal; a field effect transistor having a gate for receiving the output of the AND gate therein, a drain provided with a given voltage, and source connected to power supply terminal of the low noise amplifier through a resistor; and, a modem for sensing carrier, generating the sensed signal as the first control signal, and outputting digital demodulation data from a signal separated to the I and Q channels.

13 Claims, 3 Drawing Sheets

AUTOMATIC GAIN CONTROL CIRCUIT OF RADIO RECEIVER

CLAIM OF PRIORITY

This application makes reference to, incorporates the same herein, and claims all benefits accruing under 35 U.S.C §119 from an application entitled Automatic Gain Control Circuit Of Radio Receiver earlier filed in the Korean Industrial Property Office on Apr. 19, 1996, and there duly assigned Ser. No. 11953/1996 by that Office.

BACKGROUND OF THE INVENTION

1. Field of the Invention

The present invention relates to an automatic gain control circuit in a radio data communication system using a spread spectrum method, and in particular, an automatic gain control circuit which is digitally embodied to prevent deterioration of a bit error rate generated by saturation of a low noise amplifier located at the front stage of a receiver through an input of high power to an antenna, thereby simplifying construction thereof and improving commercialization.

2. Description of the Related Art

In general, a spread spectrum method is one type of communication method to transmit digital data in buildings. Thus, the general spread spectrum modulation method is to produce a radio frequency (RF) having high frequency and pseudo-noise (PN) coded digital data, through use of a mixer, as a spread signal having wide bandwidth and low spectrum density. As a result, the spread spectrum modulation method has a feature capable of improving performance of a system due to a decrease in external interference on the system. In order to receive the spread signal formed and transmitted by the spread spectrum method and include a stable demodulation of the received signal, it is necessary to maintain a constant level of the received signal. Therefore, an automatic gain control (AGC) amplifier located at the front stage of a receiver is utilized to maintain the received signal at a constant level.

Radio receivers having an automatic gain control (AGC) circuit have various forms. An example of a radio receiver having an AGC circuit is one comprised of: first and second signal mixers for down converting a received spread signal utilizing output frequencies of a local oscillator into an intermediate frequency (IF) signal; an IF amplifier for amplifying the IF signal and for generating a voltage according to a received signal strength indicator (RSSI); a voltage controlled oscillator for generating a reference frequency; a phase shifter for shifting the phase of the reference frequency by 90°; an I-channel mixer for mixing the amplified IF signal output of the IF amplifier with the reference frequency; a Q-channel mixer for mixing the amplified IF signal output of the IF amplifier with the phase shifted reference frequency; low pass filters for eliminating a low frequency signal from the I and Q channel signals output from the I and Q channel mixers; first and second amplifiers for amplifying the filtered signals output from the low pass filters; analog/digital (A/D) converters for converting the amplified signals output by the first and second amplifiers into respective digital signals; a modem for demodulating data from the A/D converted signals of the I and Q channels; a low pass filter for filtering the RSSI voltage; a level converter for converting the level of the signal output from the low pass filter; and a log amplifier for converting the level-converted signal in conformity with a narrow scope of a control voltage of the AGC amplifier.

As constructed above, the radio receiver uses the IF amplifier to control the AGC amplifier with the voltage proportioned to the level of the received signal. However, it is generally improper to use the RSSI voltage output of the IF amplifier directly in the above case. Therefore, before filtering the level of the RSSI voltage in the low pass filter, the level converter is necessarily required for converting the level of the RSSI voltage in conformity with the scope of the control voltage desired by the AGC amplifier. Besides, if the level of the voltage having the proper scope can not be gained for controlling the AGC amplifier even after the level of the RSSI voltage is converted, that is, if the dynamic area of the RSSI is wide while that of the control voltage of the AGC amplifier is very narrow, the radio receiver generates the control voltage having the proper scope through decreasing variation of output level with respect to input level due to use of the log amplifier.

As mentioned above, the automatic gain control method using the level converter or the log amplifier is not easy to embody the level converter, and the embodiment of the level converter may be frequently impossible in accordance with the scope of variable control voltage of the AGC amplifier. At this time, the level converter must be embodied by inevitably adding another separate circuit. Besides, as operation frequency becomes higher, it has a difficulty in embodying the log amplifier needed when the dynamic area of the AGC is very narrow and the dynamic area of the RSSI voltage as the output of the IF amplifier is wide. Moreover, the bandwidth of the low pass filter determines the feature of response time of an automatic gain control loop. If the bandwidth of the low pass filter becomes wide, the feature of the response time of the automatic gain control loop is improved while noise level in the loop is increased. As a result, gain variation of the AGC amplifier naturally becomes excessive because the control voltage of the AGC amplifier varies too rapidly. On the other hand, if the bandwidth of the LPF becomes small, the gain variation of the AGC amplifier relatively reduces more than the above case due to a decrease of the noise level in the loop, however, the feature of the response time of the automatic gain control loop may be deteriorated. Finally, to solve the above described problem, it is required to properly select the bandwidth of the LPF in order to have no effect on the performance of apparatus. However, this selection is not so easy.

SUMMARY OF THE INVENTION

It is therefore an object of the present invention to provide an automatic gain control circuit which is digitally embodied to prevent deterioration of a bit error rate generated by saturation of a low noise amplifier located at the front stage of a receiver through an input of high power to an antenna, thereby simplifying construction thereof and improving commercialization.

To achieve the above object, an automatic gain control circuit of radio data communication system using a spread spectrum method, comprising: a low noise amplifier (LNA) for low-noise amplifying a bandpass filtered signal received through an antenna; frequency down converters; a limiter for generating a RSSI voltage in order to constantly maintain the signal level of the signal received through the antenna; a unit for separating the signal transmitted through the limiter to I channel and Q channel; a comparator for comparing the received signal strength indicator RSSI voltage with a given reference voltage; a D flip-flop for inputting an output of the comparator applied to a data input terminal in synchronization to a given first control signal; an AND gate for ANDing the output of the D flip-flop and the first control signal; a field effect transistor FET having a gate for receiving the output of the AND gate therein, a drain provided with a given voltage, and source connected to power supply terminal of the low noise amplifier LNA through a resistor; and, a modem for sensing a carrier and generating a sensed signal as the first control signal, and outputting digital demodulation data signal in response to the I and Q channel signals.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
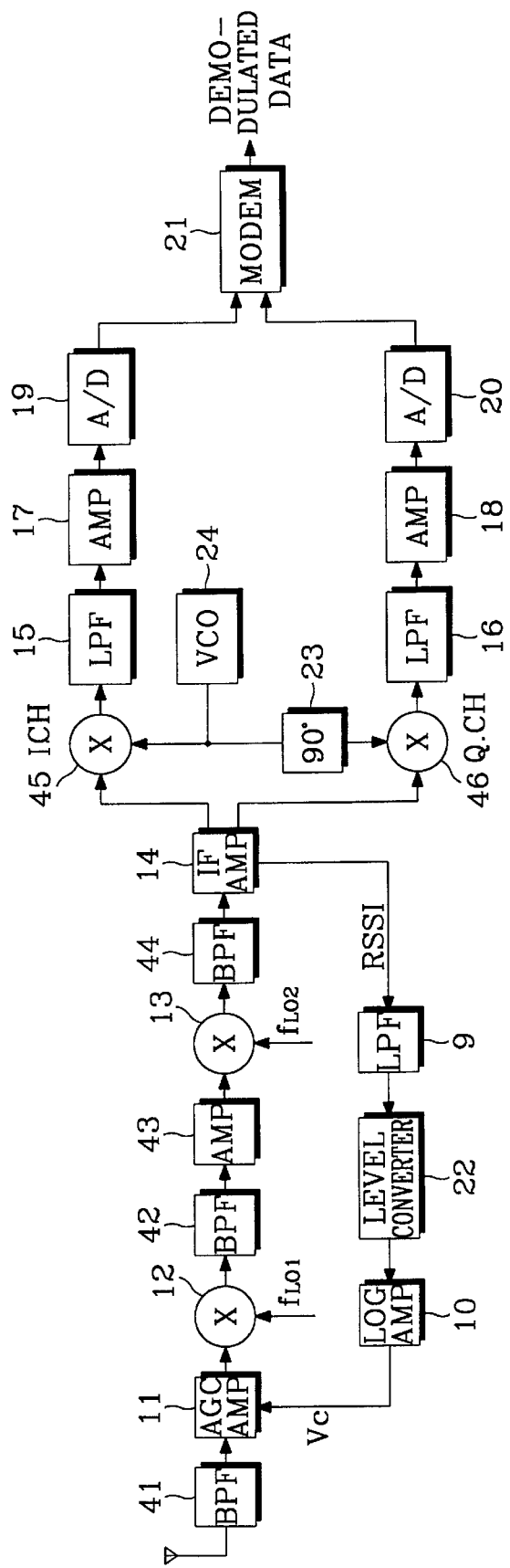
FIG. 1 is a view showing construction of an exemplary radio receiver having an automatic gain control circuit.

FIG. 1 is a view showing construction of an exemplary radio receiver having an automatic gain control circuit. As illustrated in FIG. 1, the radio receiver utilizes first and second signal mixers 12 and 13 for down converting the received spread signal into an intermediate frequency (IF) signal utilizing output frequencies ($f_{LO1}$ and $f_{LO2}$) of a local oscillator (not shown); an IF amplifier 14 for amplifying the IF signal and generating a voltage according to a received signal strength indicator (RSSI); a voltage controlled oscillator 24 for generating a reference frequency; a phase shifter 23 for shifting phase of the reference frequency by 90°; an I-channel mixer 45 for mixing the output of IF amplifier 14 with the reference frequency; a Q-channel mixer 46 for mixing the output of IF amplifier 14 with the phase shifted reference frequency; low pass filters (LPFs) 15 and 16 for low pass filtering the I and Q channel signals output from mixers 45 and 46, respectively; amplifiers 17 and 18 for amplifying the filtered signals output from LPFs 15 and 16; analog/digital (A/D) converters 19 and 20 for converting the amplified signals output by amplifiers 17 and 18 into respective digital signals; a modem 21 for demodulating data from the A/D converted signals of the I and Q channels; a LPF 9 for low-pass filtering the RSSI voltage; a level converter 22 for converting the level of the signal output from the LPF 9; and a log amplifier 10 for converting the level-converted signal in conformity with a narrow scope of control voltage Vc of AGC amplifier 11.

The radio receiver of FIG. 1 uses IF amplifier 14 to control AGC amplifier 11 with a voltage proportioned to the level of the received signal. However, it is generally improper to use the RSSI voltage output of IF amplifier 14 directly. Therefore, before filtering the RSSI voltage in LPF 9, level converter 22 converts the level of the RSSI voltage in conformity with the scope of the control voltage desired by AGC amplifier 11. Besides, if the level of the voltage having the proper scope can not be gained for controlling AGC amplifier 11, even after the level of the RSSI voltage is converted, that is, if dynamic area of the RSSI is wide while that of the control voltage of the AGC amplifier 11 is very narrow, the radio receiver generates the control voltage having the proper scope through decreasing variation of output level with respect to input level due to use of the log amplifier 10.

Figure 3:
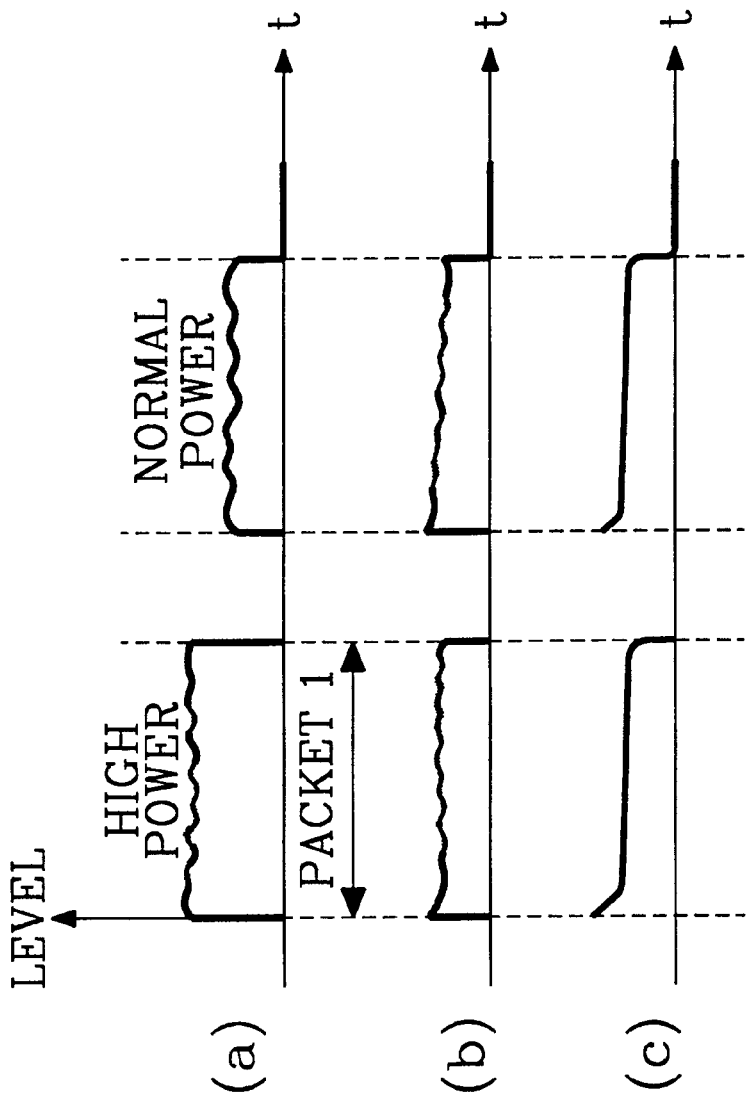
FIG. 3 is a wave form diagram showing operation of an automatic gain control circuit according to the circuits of FIGS. 1 and 2.

As mentioned above, the automatic gain control method using level converter 22 or log amplifier 10, it is not easy to embody the level converter 22, and the embodiment of level converter 22 may be frequently impossible in accordance with the scope of variable control voltage of AGC amplifier 11. At this time, the level converter must be embodied by inevitably adding another separate circuit. Besides, as the operation frequency becomes higher, it is difficult to embody log amplifier 10 which is needed when the dynamic area of the AGC 11 is very narrow and the dynamic area of the RSSI voltage as the output of IF amplifier 14 is wide. Moreover, the bandwidth of LPF 9 is to determine the feature of response time of an automatic gain control loop. If the bandwidth of LPF 9 becomes wide, the feature of the response time of the automatic gain control loop is improved while noise level in the loop is increased. As a result, gain variation of AGC amplifier 11 naturally becomes excessive because the control voltage of AGC amplifier 11 varies too rapidly. On the other hand, if the bandwidth of LPF 9 becomes small, the gain variation of AGC amplifier 11 relatively reduces more than the above case due to a decrease of the noise level in the loop, however, the feature of the response time of the automatic gain control loop may be deteriorated. Finally, to solve the above described problem, it is required to properly select the bandwidth of LPF 9 in order to have no effect on the performance of the apparatus, but this selection is not so easy. As illustrated by (b) of FIG. 3, if there is a sudden variation in the level of the received signal in one packet, the gain control can not properly accomplished due to the feature of the response time of the automatic gain control loop.

Figure 2:
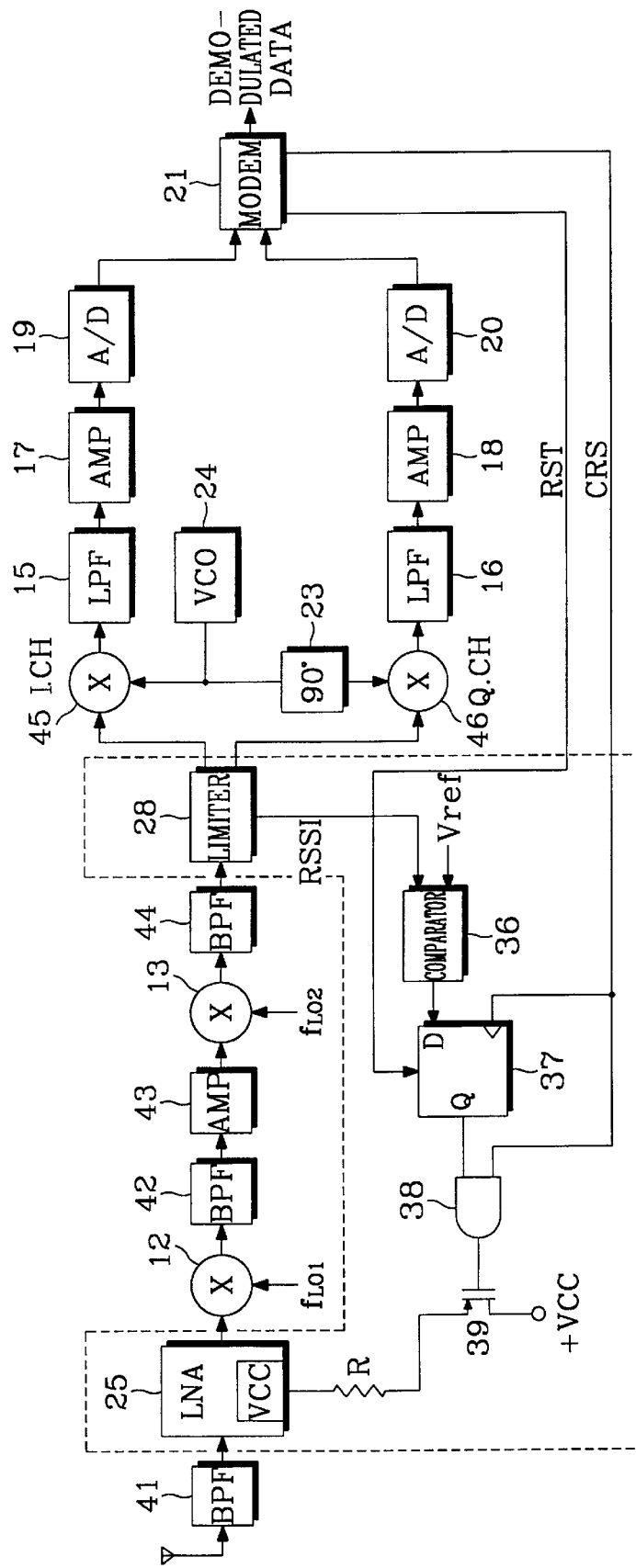
FIG. 2 is a view showing construction of a radio receiver having an automatic gain control circuit according to the principles of the present invention.

FIG. 2 is a view showing construction of a radio receiver having an automatic gain control circuit according to the present invention, which utilizes a band pass filter (BPF) 41 for receiving the spread signal from an antenna; a low noise amplifier (LNA) 25 for amplifying the signal passed by BPF 41; a limiter 28 for constantly maintaining the received signal as local oscillation frequency until before being down converted; a comparator 36 for comparing a RSSI voltage generated in limiter 28 with a given reference voltage Vref, wherein the reference voltage corresponds to a level of an input signal for turning LNA 25 off, a D flip-flop 37 having a Q output terminal for outputting an output of the comparator 36 applied to a data input terminal D thereof in synchronization with a first control signal, i.e., a carrier sensing signal CRS, output by a modem 21, and for receiving a second control signal, i.e., a reset RST signal, generated by modem 21 at a reset terminal; an AND gate 38 for ANDing the output of D flip-flop 37 with first control signal CRS; a P-channel field effect transistor (P-FET) 39 having a gate for receiving the output of AND gate 38, a drain provided with a source voltage+Vcc, i.e., +5V, and a source connected to a power supply terminal Vcc of LNA 25 through a resistor R; first and second mixers 12 and 13 for downward-frequency conversion of the received signal, output from LNA 25, in response to oscillation frequencies $f_{LO1}$ and $f_{LO2}$ of a local oscillator (not shown); limiter 28 provides an output signal, i.e., an IF output signal, and maintains the level of the output signal constant with respect to a wide variation of the level of the input signal, and outputs a voltage according to a RSSI; a voltage controlled oscillator 24 for generating a reference frequency; a phase shifter 23 for shifting phase of the reference frequency by 90°; an I-channel mixer 45 for mixing the output signal from limiter 28 with the reference frequency; a Q-channel mixer 46 for mixing the output signal from limiter 28 with the phase shifted reference frequency; LPFs 15 and 16 for low pass filtering the I and Q channel signals output from mixers 45 and 46, respectively; amplifiers 17 and 18 for amplifying the filtered signals output from LPFs 15 and 16; A/D converters 19 and 20 for converting the amplified signals output by amplifiers 17 and 18 into respective digital signals; a modem 21 for demodulating data from the A/D converted signals of the I and Q channels.

The signal received by the circuit of FIG. 2, through an antenna is first inputted to a BPF 41. The signal passed through the BPF 41 is amplified by the LNA 25 and down converted by the first mixer 12. Then the signal passes through BPF 42 and amplifier 43 to be down converted by second mixer 13, and the down converted signal, i.e., IF signal, passes through BPF 44 and limiter 28. Thereafter, limiter 28 maintains the level of the output signal constant with respect to the wide variation of the level of the input signal, and outputs the RSSI as a direct current voltage in proportion to the level of the input signal. The output of limiter 28 is separated into the I and Q channels by mixers 45 and 46, and the I and Q channel signals are input to LPFs 15 and 16, respectively. The filtered signals output from LPFs 15 and 16 are respectively amplified by amplifiers 17 and 18 and converted by A/D converters 19 and 20 prior to being input to modem 21 so that the data can be demodulated accordingly.

The RSSI voltage output of limiter 28 is provided to comparator 36 and is compared with a given reference voltage. It is desired that the reference voltage correspond to the level of the input signal which turns LNA 25 off. When the RSSI output voltage of limiter 28 is lower than the reference voltage, the output of comparator 36 will have a logic low level "0". Thus, the output of the AND gate 38 becomes "0" by the AND gate 38 no matter what value the first control signal generated in modem 35 becomes. Accordingly, the output of the source of the P-FET 39 becomes "1" (5V) due to an input of "0" to the gate of the P-FET 39, and LNA 25 turns on.

On the contrary, when the RSSI output voltage of limiter 28 is higher than the reference voltage, the output of comparator 36 becomes "1". At this time, the Q output of the D flip-flop 37 becomes "1" when first control signal CRS output from modem 35 changes from a low level signal "0" to a high level signal "1". Thus, the output of AND gate 38 becomes a high level signal "1" which is applied to the gate of P-FET 39. Accordingly, the source of P-FET 39 becomes "0" (0V) which turns LNA 25 off. The input of D flip-flop 37 is only output to the Q terminal when a transition in the clock input changes from a low level "0" to a high level "1", i.e., in response to the leading edge of a clock pulse, which corresponds to when first control signal CRS changes from "0" to "1", i.e., when an initial edge of a data packet is detected by modem 21. Accordingly, the on/off status of the LNA 25 is changed at the beginning of a data packet, but is not changed during a data packet interval. Therefore, the level of the received signal can be constantly maintained because the sudden variation of the level of the received signal occurred in one data packet disappears. As illustrated by (c) of FIG. 3, if there is a sudden variation in the level of the received signal, shown in (b) during a data packet interval, the level of the received signal is maintained constant. Accordingly, the automatic gain control circuit of FIG. 2 prevents deterioration of a bit error rate generated by saturation of a low noise amplifier which may receive a signal of high power (a) in FIG. 3 through the antenna.

Conclusively speaking, when the log amplifier and the level converter are used according to the circuit of FIG. 1, the embodiment thereof is not easy, the operating frequency is also limited, and though a common chip is utilized, it is unsatisfied in terms of the cost. And, when the RSSI voltage is low pass filtered, setting of the bandwidth has a heavy effect on the performance of the device because the feature of the response time of the automatic gain control loop is determined by the bandwidth. However, the automatic gain control device according to an embodiment of the present invention has an advantage in that the LNA can be turned on/off through simply using a logic gate without using a log amplifier and level converter, so that the automatic gain control function can be performed as well as the cost of the automatic gain control device is more profitable than that of the prior art automatic gain control device.

While there have been illustrated and described what are considered to be preferred embodiments of the present invention, it will be understood by those skilled in the art that various changes and modifications may be made, and equivalents may be substituted for elements thereof without departing the true scope of the present invention. Therefore, it is intended that the present invention not be limited to the particular embodiment disclosed as the best mode contemplated for carrying out the present invention, but that the present invention includes all embodiments falling within the scope of the appended claims.

What is claimed is:

1. An automatic gain control circuit of a radio data communication system using a spread spectrum method, comprising:

a band pass filter for passing a desired frequency band of a signal received via an antenna of said radio data communication system;

low noise amplifier for low noise amplifying an output of said band pass filter;

down converting means for generating an IF signal by down converting a frequency of an output of said low noise amplifier;

a limiter for generating a received signal strength voltage indicative of a received signal strength of said IF signal;

demodulation means for producing a first control signal, a second control signal and demodulated data by demodulating said IF signal;

a comparator for comparing said received signal strength indicator voltage with a given reference voltage;

a D flip-flop having a data input terminal connected to an output terminal of said comparator, a clock terminal connected to receive said first control signal, a reset terminal connected to receive said second control signal and a Q output terminal for outputting a signal applied to said data terminal in response to a leading edge of said first control signal;

an AND gate having a first terminal connected to said Q output terminal of said D flip-flop and a second terminal connected to receive said first control signal; and a field effect transistor having a gate for receiving an output of said AND gate, a drain provided with a given voltage, and source connected to a power supply terminal of said low noise amplifier through a resistor.

2. The circuit as set forth claim 1, wherein said IF signal is output through said limiter and said demodulation means comprises:

means for separating said IF signal output through said limiter into I and Q channel signals;

analog-to-digital converting means for converting said I and Q channel signals into digital signal; and a modem responsive to said digital signals for generating said first control signal, said second control signal and said demodulated data.

3. The circuit as set forth in claim 2, wherein D flip-flop supplies said output of said comparator to said AND gate when said modem generates said second control signal by detecting a beginning of a data packet.

4. The circuit as set forth in claim 1, wherein said low noise amplifier is turned on when said gate of said field effect transistor receives a low logic level output of said AND gate.

5. The circuit as set forth in claim 1, wherein said low noise amplifier is turned off when said gate of said field effect transistor receives a high logic level output of said AND gate.

6. The circuit as set forth in claim 5, wherein said output of said AND gate has said high logic level when said received signal strength indicator voltage is higher than said reference voltage and said clock input terminal of said D flip-flop receives said leading edge of said first control signal.

7. The circuit as set forth in claim 6, wherein said demodulation means comprises a modem for generating said first control signal, said second control signal and said demodulated data.

8. The circuit as set forth in claim 7, wherein said leading edge of said first control signal is indicative of a change from a low logic level of said first control signal to a high logic level when said modem detects a beginning of a data packet.

9. An automatic gain control method for controlling a gain of a low noise amplifier located at the front stage of a receiver in a radio data communication system utilizing spread spectrum communications, said method comprising the steps of:

band pass filtering a signal received through an antenna of said radio data communication system to produce a band pass filtered signal;

applying said band pass filtered signal, via a low noise amplifier, to a frequency down converter to produce an IF signal;

passing said IF signal through a limiter to a demodulator;

demodulating said IF signal passed through said limiter to produce demodulated data, a first control signal and a second control signal;

outputting a received signal strength indicator voltage from said limiter;

comparing said received signal strength indicator voltage to a reference voltage;

turning off said low noise amplifier when said received signal strength indicator voltage is greater than said reference voltage and in sync with said first control signal.

10. The method as set forth in claim 9, wherein said step of generating said first control voltage comprises detecting a data packet in the IF signal being demodulated by said demodulator.

11. The method as set forth in claim 9, further comprising a step of controlling a field effect transistor to selectively provide a power supply voltage to said low noise amplifier to turn said low noise amplifier on or off.

12. The method as set forth in claim 10, further comprising a step of controlling a field effect transistor to selectively provide a power supply voltage to said low noise amplifier to turn said low noise amplifier on or off.

13. The method as set forth in claim 12, wherein said step of controlling a field effect transistor comprises said comparing step and further comprises:

outputting a result of said comparing step through a D flip-flop when said data packet is detected;

applying said result to a first terminal of an AND gate and applying said first control signal to a second terminal of said AND gate; and providing an output of said AND gate to a gate terminal of said field effect transistor.

* * * * *